(12) United States Patent
Gan et al.

(10) Patent No.: US 9,748,831 B2
(45) Date of Patent: Aug. 29, 2017

(54) POWER CONVERSION DEVICE AND METHOD FOR TRANSMITTING PROTECTION SIGNAL USING THE SAME

(71) Applicant: Delta Electronics (Shanghai) Co., Ltd., Shanghai (CN)

(72) Inventors: Hong-Jian Gan, Shanghai (CN); Ming Wang, Shanghai (CN); Jian-Ping Ying, Shanghai (CN); Bing Zhang, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 65 days.

(21) Appl. No.: 14/740,280

(22) Filed: Jun. 16, 2015

(65) Prior Publication Data

US 2015/0381029 A1 Dec. 31, 2015

(30) Foreign Application Priority Data

Jun. 25, 2014 (CN) .......................... 2014 1 0290589

(51) Int. Cl.
*H02M 1/32* (2007.01)
*H03K 17/082* (2006.01)
*H03K 17/18* (2006.01)

(52) U.S. Cl.
CPC ............ *H02M 1/32* (2013.01); *H03K 17/082* (2013.01); *H03K 17/18* (2013.01); *H02M 2001/327* (2013.01)

(58) Field of Classification Search
None
See application file for complete search history.

(56) References Cited

U.S. PATENT DOCUMENTS 5,596,466 A 1/1997 Ochi
5,900,683 A * 5/1999 Rinehart ............ H03K 17/0828
307/126

(Continued)

FOREIGN PATENT DOCUMENTS

CN 2735658 Y 10/2005
EP 0708529 A2 4/1996
(Continued)

*Primary Examiner* — Jeffrey Gblende
(74) *Attorney, Agent, or Firm* — CKC & Partners Co., Ltd.

(57) ABSTRACT

A power conversion device includes a power semiconductor switch module, a driving signal-transmitting circuit, a plurality of failure-detecting circuits, a protection signal transmitting circuit and a control circuit. The driving signal transmitting circuit receives a control signal and generates a driving signal according to the control signal to drive the power semiconductor switch module. The failure detecting circuits generate a fault signal when they detect that one of the power semiconductor switches and/or the driving signal transmitting circuit is malfunctioning. The isolated pulse transforming unit of the protection signal transmitting circuit receives a corresponding fault pulse signal generated according to the fault signal, and outputs a protection pulse signal. The control circuit generates the control signal and receives a protection signal generated according to the protection pulse signal. The control circuit generates a turn off signal according to the protection signal to turn off the power semiconductor switch module.

28 Claims, 8 Drawing Sheets

(56) References Cited

U.S. PATENT DOCUMENTS

| | | | | |
|---|---|---|---|---|
| 2012/0153719 A1* | 6/2012 | Inaba | .................... | B60L 3/003 307/10.1 |
| 2012/0218669 A1* | 8/2012 | Ioannidis | ................ | H02H 7/12 361/18 |
| 2013/0200865 A1* | 8/2013 | Wimpenny | ............ | H02M 1/08 323/271 |

FOREIGN PATENT DOCUMENTS

| | | |
|---|---|---|
| EP | 0743751 A2 | 11/1996 |
| TW | I347073 B | 8/2011 |
| TW | 201315074 A1 | 4/2013 |
| TW | I413327 B | 10/2013 |

\* cited by examiner

POWER CONVERSION DEVICE AND METHOD FOR TRANSMITTING PROTECTION SIGNAL USING THE SAME

RELATED APPLICATIONS

This application claims priority to Chinese Application Serial Number 201410290589.3, filed Jun. 25, 2014, which is herein incorporated by reference.

BACKGROUND

Field of Invention

The present invention relates to a device and a method for transmitting a signal. More particularly, the present invention relates to a power conversion device and a method for transmitting a protection signal using the same.

Description of Related Art

With the advancement of science and technology, the techniques used by the electronic power industry are maturing; hence, power supply devices are widely applied in various electronic devices. Reliability is a basic requirement for such an electronic power device. A reliable electronic power device can stably operate under normal operating conditions, and can effectively protect itself when the electronic power device is malfunctioning, so that the electronic power device will not be damaged.

When malfunctioning, the electronic power device mainly uses an optical-isolation component or an isolated pulse transformer to transmit a fault signal. However, if an optical-isolation component is used to transmit a fault signal, the manufacturing cost of the electronic power device will be increased and the reliability thereof will be lowered. Moreover, if an isolated pulse transformer is used to transmit a fault signal, an individual isolated pulse transformer must be disposed for each power semiconductor switch so as to return the fault signal thereof; consequently, the structure of the electronic power device becomes complicated, which is unfavorable for the manufacturing process.

In view of the foregoing, problems and disadvantages are associated with existing products that require further improvement. However, those skilled in the art have yet to find a solution.

SUMMARY

The following presents a simplified summary of the disclosure in order to provide a basic understanding to the reader. This summary is not an extensive overview of the disclosure and it does not identify key/critical elements of the present disclosure or delineate the scope of the present disclosure.

One aspect of the present disclosure is to provide a power conversion device that comprises a power semiconductor switch module, a driving signal transmitting circuit, a plurality of fault detecting circuits, a protection signal transmitting circuit and a control circuit. The power semiconductor switch module comprises a plurality of power semiconductor switches. The driving signal transmitting circuit is configured to receive a control signal, and generate a driving signal according to the control signal to drive the conduction or non-conduction of the power semiconductor switch module. Each of the plurality of fault detecting circuits is configured to correspondingly detect one of the plurality of power semiconductor switches and/or the driving signal transmitting circuit, and generate a fault signal when one of the plurality of power semiconductor switches and/or the driving signal transmitting circuit is malfunctioning. The protection signal transmitting circuit comprises an isolated pulse transforming unit. The isolated pulse transforming unit receives a corresponding fault pulse signal generated according to the fault signal, and outputs a protection pulse signal. The control circuit generates the control signal and receives the protection signal generated according to the pulse signal, and generates a control-terminal turn-off signal according to the protection signal to turn off the power semiconductor switch module.

Another aspect of the present disclosure provides a method for transmitting a protection signal of a power conversion device. The method for transmitting a protection signal comprises the following steps:

detecting a plurality of power semiconductor switches within a power semiconductor switch module and/or a driving signal transmitting circuit, and generating a fault signal when one of the plurality of power semiconductor switches and/or a driving signal transmitting circuit is malfunctioning;

using an isolated pulse transforming unit to receive a corresponding fault pulse signal generated according to the fault signal, and to output a protection pulse signal;

receiving a protection signal generated according to the protection pulse signal; and generating a control-terminal turn-off signal according to the protection signal, and transmitting the control-terminal turn-off signal to turn off the power semiconductor switch module.

In view of the foregoing, embodiments of the present disclosure provide a power conversion device and a method for transmitting a protection signal using said device to address the problems of high manufacturing cost and low reliability caused by using an optical-isolation component to transmit a fault signal, as well as to address the problem of complicated structure of the electronic power device caused by using a single isolated pulse transforming unit to transmit a fault signal.

These and other features, aspects, and advantages of the present disclosure, as well as the technical means and embodiments employed by the present disclosure, will become better understood with reference to the following description in connection with the accompanying drawings and appended claims.

BRIEF DESCRIPTION OF THE DRAWINGS

The disclosure can be more fully understood by reading the following detailed description of the embodiment, with reference made to the accompanying drawings as follows.

In accordance with common practice, the various described features/elements are not drawn to scale but instead are drawn to best illustrate specific features/elements relevant to the present disclosure. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present examples may be constructed or utilized. The description sets forth the functions of the examples and the sequence of steps for constructing and operating the examples. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include singular forms of the same.

To solve the problems caused by using an optical-isolation component and a single isolated pulse transformer to transmit a fault signal in an electronic power device, the present disclosure provides a power conversion device and a method for transmitting a protection signal in said device. The power conversion device mainly uses an isolated pulse transformer to transmit a fault signal, so as to address the problems of high manufacturing cost and low reliability associated with using an optical-isolation component to transmit a fault signal. Furthermore, the power conversion device according to the present disclosure only requires one isolated pulse transformer and one protection signal processing circuit to return a fault signal, thereby addressing the problem of a complicated structure of an electronic power device resulting from each power semiconductor switch requiring an individual isolated pulse transformer to return a fault signal thereof. The present power conversion device and the method for transmitting a protection signal in such a device are described in detailed hereinbelow.

Figure 1:
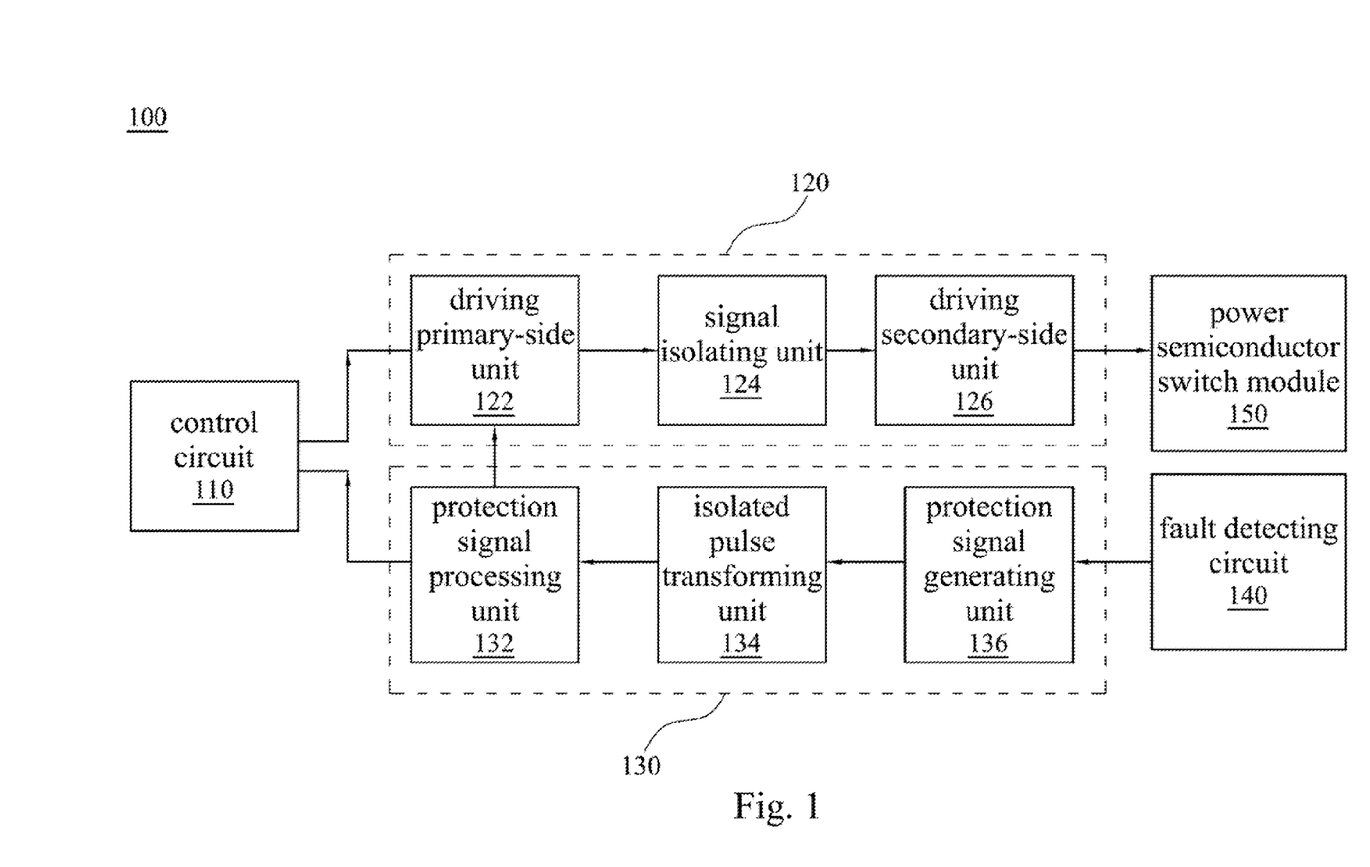
FIG. 1 is a schematic diagram illustrating a power conversion device according to one embodiment of the present disclosure.

FIG. 1 is a schematic diagram illustrating a power conversion device 100 according to one embodiment of the present disclosure. As illustrated, said power conversion device 100 comprises a control circuit 110, a driving signal transmitting circuit 120, a protection signal transmitting circuit 130, a fault detecting circuit 140 and a power semiconductor switch module 150. Specifically, the driving signal transmitting circuit 120 comprises a driving primary-side unit 122, a signal isolating unit 124 and a driving secondary-side unit 126; and the protection signal transmitting circuit 130 comprises a protection signal processing unit 132, an isolated pulse transforming unit 134 and a protection signal generating unit 136.

Regarding the structural connection of the elements in the power conversion device 100, the control circuit 110 is electrically coupled to the driving primary-side unit 122, the driving primary-side unit 122 is coupled to the signal isolating unit 124, the signal isolating unit 124 (the signal isolating unit can be a signal magnetic-isolating unit or a signal optical-isolating unit) is coupled to the driving secondary-side unit 126, and the driving secondary-side unit 126 is electrically coupled to the power semiconductor switch module 150. Moreover, the control circuit 110 is electrically coupled to the protection signal processing unit 132, the protection signal processing unit 132 is electrically coupled to the isolated pulse transforming unit 134, the isolated pulse transforming unit 134 is electrically coupled to the protection signal generating unit 136, and the protection signal generating unit 136 is coupled to the fault detecting circuit 140. However, the present disclosure is not limited to FIG. 1, and the configuration shown therein is only used to exemplify one implementation of the present disclosure.

When the power conversion device 100 is operating normally, the control circuit 110 outputs a control signal, and the driving primary-side unit 122 receives said control signal and generates a driving pulse signal according to the control signal, in which the control signal is a logic level signal having a high or low voltage level. Moreover, the driving primary-side unit 122 modulates the control signal to generate the driving pulse signal, in which the driving pulse signal comprises an ON pulse signal and an OFF pulse signal, each of the width of the ON pulse signal and the width of the OFF pulse signal can be a value between 50 ns-10 us, the ON pulse signal corresponds to the rising edge of the control signal, and the OFF pulse signal corresponds to the falling edge of the control signal. For example, when the driving primary-side unit 122 receives the rising edge of the control signal, it modulates the control signal to generate the ON pulse signal, and when the driving primary-side unit 122 receives the falling edge of the control signal, it modulates the control signal to generate the OFF pulse signal. Additionally, the signal isolating unit 124 is configured to receive and transmit the driving pulse signal. Thereafter, the driving secondary-side unit 126 receives the driving pulse signal, and converts the driving pulse signal into a driving signal to drive the conduction or non-conduction of the power semiconductor switch module 150. In the present embodiment, the signal isolating unit 124 is a signal magnetic-isolating unit, in which the driving secondary-side unit 126 processes the driving pulse signal to generate and amplify a driving signal having a high or low voltage level, so that the driving signal is capable of driving the power semiconductor switch module 150. For example, when the driving secondary-side unit 126 receives the ON pulse signal, the ON pulse signal is latched in a high voltage level, and when the driving secondary-side unit 126 receives the OFF pulse signal, the OFF pulse signal is latched in a low voltage level, so that the driving signal has a high or low voltage level. In this scenario, the rising edge of the driving signal corresponds to the ON pulse signal, and the falling edge of the driving signal corresponds to the OFF pulse signal.

On the other hand, when the power conversion device 100 is malfunctioning, the present device operates as outlined in the paragraphs below.

The fault detecting circuit 140 correspondingly detects a plurality of power semiconductor switches (not shown) of the power semiconductor switch module 150 or the driving signal transmitting circuit 120, or both of the power semiconductor switches and the driving signal transmitting circuit 120. When one of the plurality of power semiconductor switches or the driving signal transmitting circuit 120, or both of the power semiconductor switches and the driving signal transmitting circuit 120 is/are malfunctioning, the fault detecting circuit 140 generates a fault signal, and the fault detecting circuit 140 transmits the fault signal to the protection signal generating unit 136. After receiving the fault signal, the protection signal generating unit 136 generates a corresponding fault pulse signal according to the fault signal. In one embodiment, said fault pulse signal may be a narrow pulse signal suitable for transmission by the isolated pulse transforming unit 134.

Thereafter, the isolated pulse transforming unit 134 receives the fault pulse signal and the output protection pulse signal. The protection signal processing unit 132 receives the protection pulse signal and generates a protection signal according to the protection pulse signal, the protection signal processing unit 132 transmits the protection signal to the control circuit 110, the control circuit 110 receives the protection signal and generates a control-terminal turn-off signal according to the protection signal, and the control circuit 110 transmits the control-terminal turn-off signal to the power semiconductor switch module 150 via the driving signal transmitting circuit 120 to turn off the power semiconductor switch module 150. In another embodiment, the protection signal processing unit 132 simultaneously transmits the protection signal to the control circuit 110 and the driving primary-side unit 122. The driving primary-side unit 122 then generates a driving-terminal turn-off signal according to the protection signal, and transmits the driving-terminal turn-off signal to the power semiconductor switch module 150 to turn off the power semiconductor switch module 150.

In view of the foregoing, embodiments according to the present disclosure provide an power conversion device 100 using an isolated pulse transforming unit 134 to transmit the fault signal; hence, as compared to using an optical-isolation component (such as, an optic fiber or an optical coupler) to transmit a fault signal, using the isolated pulse transforming unit 134 results in a lower manufacturing cost and a higher device reliability.

It should be noted that the power semiconductor switch module 150 illustrated in FIG. 1 is only one power semiconductor switch module within the power conversion device 100. In practice, the power conversion device 100 may comprise a plurality of power semiconductor switch modules (not shown), and the plurality of power semiconductor switch modules can be serially connected. Each of these power semiconductor switch modules may comprise a driving signal transmitting circuit and a protection signal transmitting circuit. Accordingly, in another embodiment, the protection signal processing unit 132 may simultaneously transmit the protection signal to the driving primary-side unit 122 and the control circuit 110. After the driving primary-side unit 122 receives the protection signal, the driving primary-side unit 122 generates a driving-terminal turn-off signal according to the protection signal and transmits the driving-terminal turn-off signal to the power semiconductor switch module driven by said driving primary-side unit 122, so as to turn off the power semiconductor switch module. Moreover, after the control circuit 110 receives the protection signal, the control circuit 110 generates a control-terminal turn-off signal according to the protection signal and transmits the control-terminal turn-off signal to the other driving signal transmitting circuit(s) of the power conversion device 100, so as to turn off the other power semiconductor switch module(s) of the power conversion device 100, thereby achieving the purpose of turning off all the power semiconductor switch modules of the power conversion device 100.

In one embodiment, the power semiconductor switch modules can be switch valves in the same bridge arm in the power conversion device 100, or switch valves in different bridge arms in the power conversion device 100.

Figure 2:
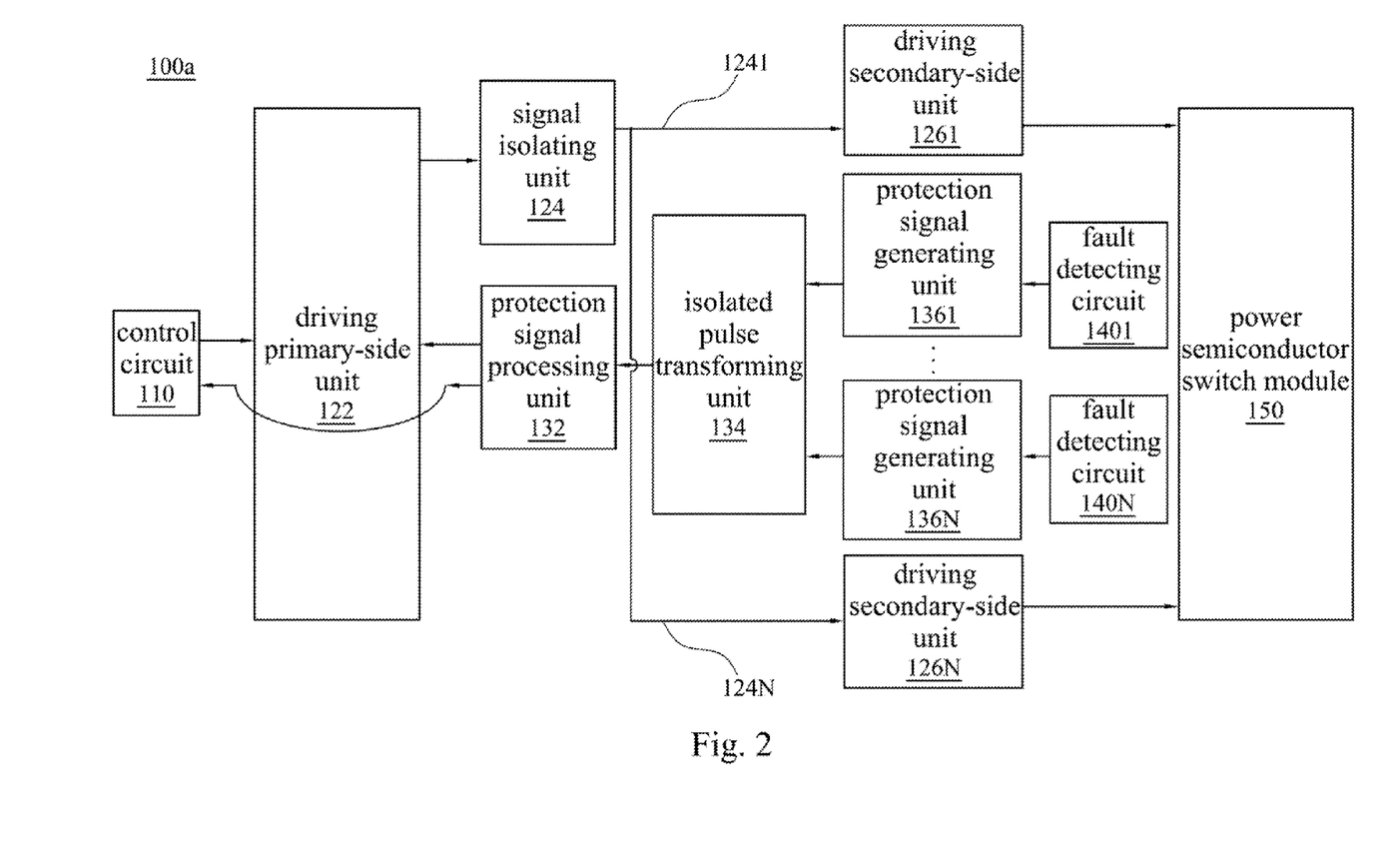
FIG. 2 is a schematic diagram illustrating a power conversion device according to another embodiment of the present disclosure.

FIG. 2 is a schematic diagram illustrating a power conversion device 100a according to another embodiment of the present disclosure. In comparison with the power conversion device 100 illustrated in FIG. 1, the present power conversion device 100a comprises a signal isolating unit having N outputs 1241~124N, N driving secondary-side units 1261~126N, N fault detecting circuits 1401~140N, and N protection signal generating units 1361~136N. It should be noted that in the power conversion device 100a illustrated in FIG. 2, the reference numbers of the electronic components that are similar to those used in the power conversion device 100 illustrated in FIG. 1 have the same electrical operating characteristics. For the sake of brevity, the electric components with similar reference numbers will not be discussed in detail hereinbelow, and rather, only the differences between the power conversion device 100 and the power conversion device 100a are discussed.

Regarding the structural connection of the elements in the power conversion device 100a, each of the protection signal generating units 1361~136N is coupled to one of the fault detecting circuits 1401~140N. For example, the protection signal generating unit 1361 is coupled to the fault detecting circuit 1401. Moreover, the protection signal generating units 1361~136N are all coupled to a single isolated pulse transforming unit 134, while the isolated pulse transforming unit 134 is electrically coupled to a single protection signal processing unit 132. Moreover, each of the driving secondary-side units 1261~126N is electrically coupled to one of the power semiconductor switches (not shown) in the power semiconductor switch module 150. Furthermore, the outputs 1241~124N of the signal isolating unit are respectively coupled to the driving secondary-side units 1261~126N. For example, the output 1241 of the signal isolating unit 124 is coupled to the driving secondary-side unit 1261, and the input of the signal isolating unit 124 is coupled to the driving primary-side unit 122.

In operation, said fault detecting circuits 1401~140N are configured to detect multiple power semiconductor switches in the power semiconductor switch module 150, and when any power semiconductor switch in the power semiconductor switch module 150 is malfunctioning, to generate a fault signal. For example, if the fault detecting circuit 1401 detects that the corresponding power semiconductor switch in the power semiconductor switch module 150 is malfunctioning, the fault detecting circuit 1401 generates a fault signal, and transmits the fault signal to the protection signal generating unit 1361. Moreover, the protection signal generating unit 1361 generates a corresponding fault pulse signal according to the fault signal, and transmits the fault pulse signal via the isolated pulse transforming unit 134 to protection signal processing unit 132.

On the other hand, if the fault detecting circuits 1401 and 140N simultaneously detect that the corresponding power semiconductor switches in the power semiconductor switch module 150 are malfunctioning (for example, the fault detecting circuit 1401 detects that a power semiconductor switch is malfunctioning, and the fault detecting circuit 140N detects that another power semiconductor switch is malfunctioning), the two fault signals respectively generated by the fault detecting circuit 1401 and the fault detecting circuit 140N can be used to generate two corresponding fault pulse signals using the corresponding protection signal generating units 1361, 136N, and the single isolated pulse transforming unit 134 is used to generate a protection pulse signal. The protection signal processing unit 132 is subsequently used to generate a protection signal according to the protection pulse signal and return the protection signal.

In this way, as compared with the circuit structure that requires each power semiconductor switch to use an isolated pulse transformer to transmit the fault signal thereof, the power conversion device 100a according to the present disclosure only requires a single isolated pulse transformer 134 and a single protection signal processing circuit 132 to return a fault signal; therefore, the present circuit structure is more simple, which is advantageous for manufacture and allows for a reduction in manufacturing cost.

Figure 3A:
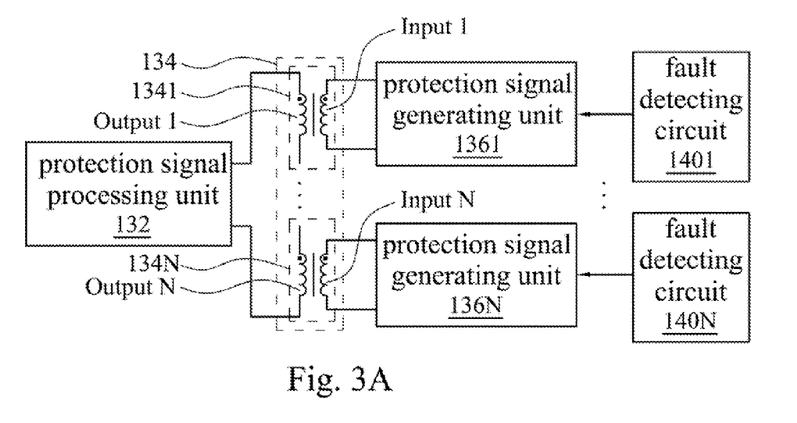
FIG. 3A is a schematic diagram illustrating an isolated pulse transforming unit according to an embodiment of the present disclosure.
Figure 3B:
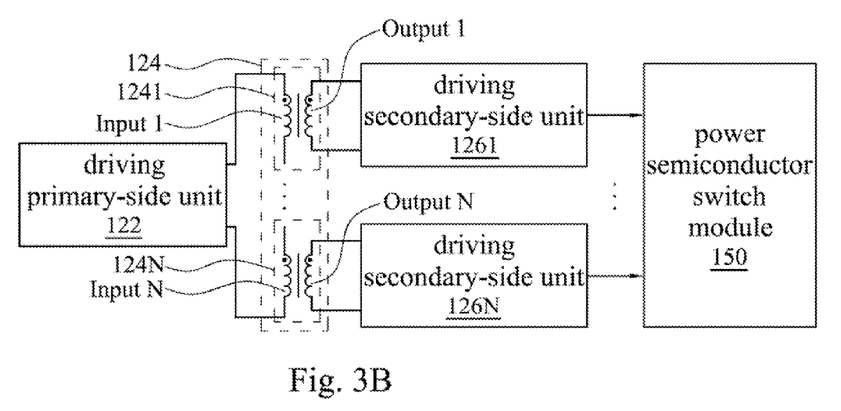
FIG. 3B is a schematic diagram illustrating a signal magnetic-isolating unit according to an embodiment of the present disclosure.
Figure 4A:
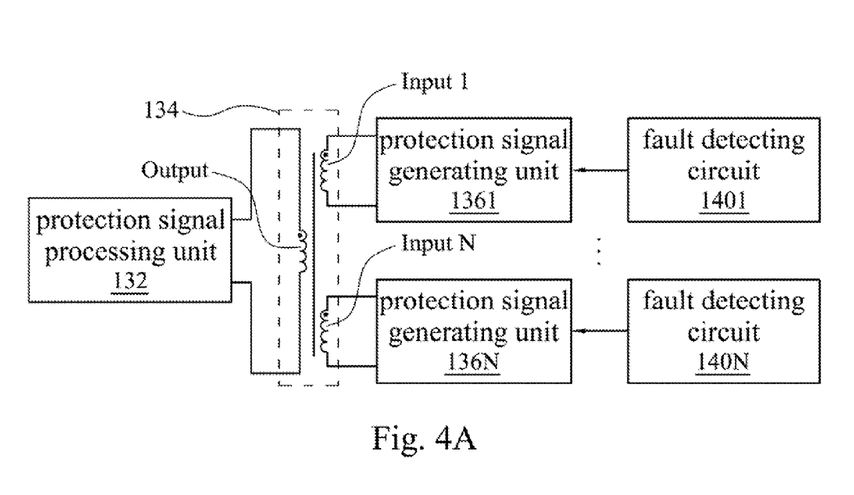
FIG. 4A a is a schematic diagram illustrating an isolated pulse transforming unit according to another embodiment of the present disclosure.
Figure 4B:
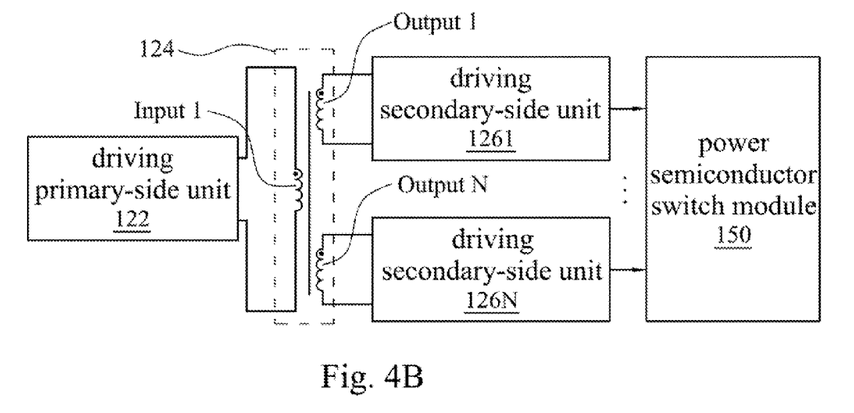
FIG. 4B is a schematic diagram illustrating a signal magnetic-isolating unit according to another embodiment of the present disclosure.
Figure 5A:
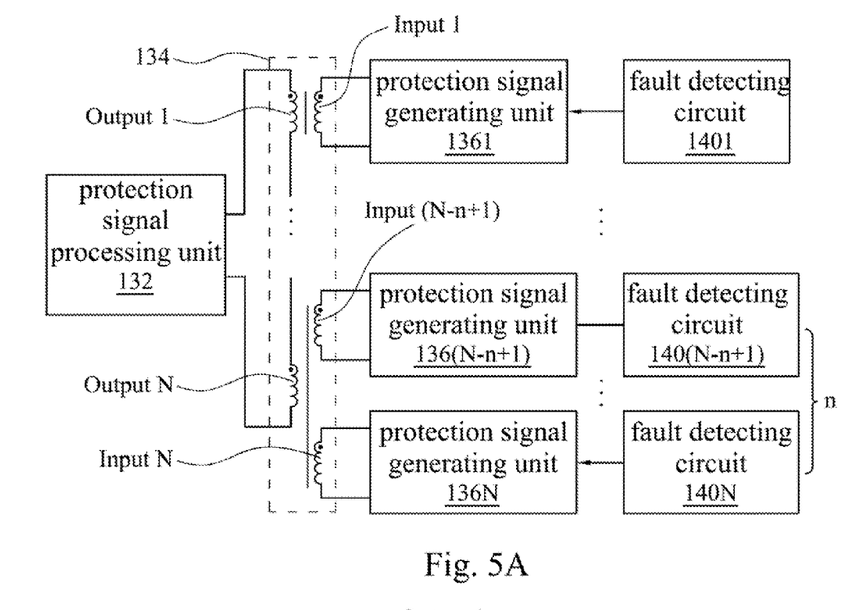
FIG. 5A is a schematic diagram illustrating an isolated pulse transforming unit according to still another embodiment of the present disclosure.

FIG. 3A, FIG. 4A and FIG. 5A are schematic diagrams illustrating different means of implementing the isolated pulse transforming unit 134 according to certain embodiments of the present disclosure. Moreover, FIG. 3B, FIG. 4B and FIG. 58B are schematic diagrams illustrating different means of implementing the signal isolating unit 124 according to certain embodiments of the present disclosure, in which said signal isolating unit 124 can be a signal magnetic-isolating unit.

As illustrated in FIG. 3A, the isolated pulse transforming unit 134 comprises a plurality of pulse transformers 1341~134N. Each pulse transformer comprises an input winding, a magnetic core and an output winding. For example, the pulse transformer 1341 comprises an input winding Input1, a magnetic core and an output winding Output1. Moreover, the input winding of each pulse transformer is correspondingly electrically coupled to the protection signal generating units 1361~136N. For example, the input winding Input1 of the pulse transformer 1341 is electrically coupled to the protection signal generating unit 1361. Moreover, all the output windings Output1~OutputN of all the pulse transformers 1341~134N are serially connected in turn, and the two ends of the assembly of these serially connected output windings Output1~OutputN are electrically coupled to the protection signal processing unit 132.

In one embodiment, as illustrated in FIG. 3B, the signal magnetic-isolating unit 124 comprises a plurality of driving pulse-isolation transformers 1241~124N. Each driving pulse-isolation transformer comprises an input winding, a magnetic core and an output winding. For example, the driving pulse transformer 1241 comprises an input winding Input1, a magnetic core and an output winding Output1. Moreover, the output winding of each driving pulse-isolation transformer is correspondingly electrically coupled to one of the driving secondary-side units 1261~126N. For example, the output winding Output1 of the driving pulse transformer 1241 is electrically coupled to the driving secondary-side unit 1261. Moreover, all the input windings Input1~InputN of the driving pulse-isolation transformers 1241~124N are serially connected in turn. The two ends of the assembly of these serially connected input windings Input1~InputN are electrically coupled to the driving primary-side unit 122.

Another embodiment is described with reference to FIG. 4A. It should be noted that the isolated pulse transforming unit 134 illustrated in FIG. 3A comprises a plurality of output windings Output1~OutputN, while the isolated pulse transforming unit 134 illustrated in FIG. 4A only comprises a single output winding Output. Specifically, the isolated pulse transforming unit 134 illustrated in FIG. 4A comprises a pulse transformer, in which said pulse transformer comprises a plurality of input windings Input1~InputN, a magnetic core and an output winding Output. Each input winding is correspondingly electrically coupled to the protection signal generating units 1361~136N. For example, the input winding Input1 is electrically coupled to the protection signal generating unit 1361. Moreover, the output winding Output is electrically coupled to the protection signal processing unit 132.

Still another embodiment is described with reference to FIG. 4B. It should be noted that the signal isolating unit 124 illustrated in FIG. 3B comprises a plurality of input windings Input1~InputN, while the signal magnetic-isolating unit 124 illustrated in FIG. 4B only comprises an input winding Input1. Specifically, the signal isolating unit 124 illustrated in FIG. 4B comprises a driving pulse-isolation transformer, in which said driving pulse-isolation transformer comprises an input winding Input1, a magnetic core and a plurality of output windings Output1~OutputN. Each output winding is correspondingly electrically coupled to the driving secondary-side units 1261~126N. For example, the output winding Output1 is electrically coupled to the driving secondary-side unit 1261. Moreover, the input winding Input is electrically coupled to the driving primary-side unit 122.

Still yet another embodiment is described with reference is to FIG. 5A. It should be noted that the isolated pulse transforming unit 134 illustrated in FIG. 5A basically is the combined circuit structure of the isolated pulse transforming units 134 illustrated in FIG. 3A and FIG. 4A. Specifically, a portion of the circuit structure of the isolated pulse transforming unit 134 illustrated in FIG. 5A uses the circuit structure of the isolated pulse transforming unit 134 illustrated in FIG. 3A. For example, the isolated pulse transforming unit 134 of FIG. 5A comprises a plurality of pulse transformers, in which each pulse transformer comprises an input winding Input1, a magnetic core and an output winding Output1, and the input winding Input1 is electrically coupled to the protection signal generating unit 1361.

Moreover, another portion of the circuit structure of the isolated pulse transforming unit 134 illustrated in FIG. 5A uses the circuit structure of the isolated pulse transforming unit 134 illustrated in FIG. 4A. For example, the pulse transformer of the isolated pulse transforming unit 134 illustrated in FIG. 5A comprises a plurality of input windings Input(N-n+1)~InputN, a magnetic core and an output winding OutputN, in which each input winding is correspondingly electrically coupled to the protection signal generating unit. For example, the input winding InputN is electrically coupled to the protection signal generating unit 136N. It should be noted that all the output windings Output1~OutputN of the pulse transformers are serially connected in turn, and the two ends of the assembly of these serially connected output windings Output1~OutputN are electrically coupled to the protection signal processing unit 132. In the present disclosure, N is a positive integer and n is a positive integer no greater than N.

Still yet another embodiment is described with reference to FIG. 5B. It should be noted that the signal isolating unit 124 illustrated in FIG. 5B basically is the combined circuit structure of the isolated pulse transforming units 134 illustrated in FIG. 3B and FIG. 4B. Specifically, a portion of the circuit structure of the signal isolating unit 124 illustrated in FIG. 5B uses the circuit structure of the signal isolating unit 124 illustrated in FIG. 3B. For example, the signal magnetic-isolating unit 124 of FIG. 5B comprises a plurality of driving pulse-isolation transformers, in which each driving pulse-isolation transformer comprises an input winding Input1, a magnetic core and an output winding Output1, and the output winding Output1 is electrically coupled to the driving secondary-side unit 1261.

Figure 5B:
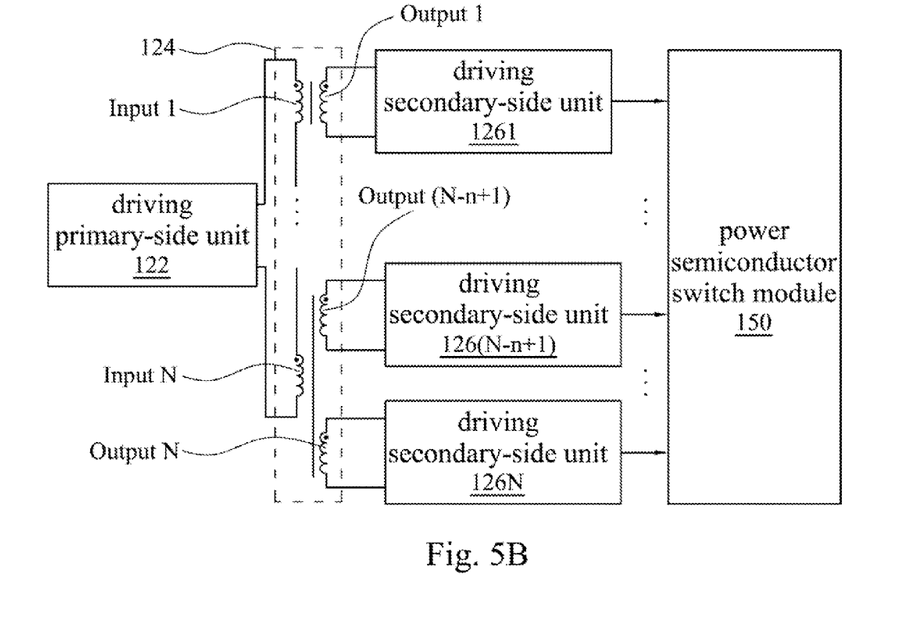
FIG. 5B is a schematic diagram illustrating a signal magnetic-isolating unit according to still another embodiment of the present disclosure.

Moreover, another portion of the circuit structure of the signal magnetic-isolating unit 124 illustrated in FIG. 5B uses the circuit structure of the signal magnetic-isolating unit 124 illustrated in FIG. 4B. For example, the driving pulse-isolation transformer of the signal magnetic-isolating unit 124 illustrated in FIG. 5B comprises an input winding InputN, a magnetic core and a plurality of output windings Output(N−n+1)~OutputN, in which each output winding is correspondingly electrically coupled to the driving secondary-side unit. For example, the output winding OutputN is electrically coupled to the driving secondary-side unit 126N. It should be noted that all the input windings Input1~InputN of the pulse transformers are serially connected in turn, in which the two ends of the assembly of these serially connected input windings Input1~InputN are electrically coupled to the driving primary-side unit 122. In the present disclosure, N is a positive integer and n is a positive integer no greater than N.

Figure 6:
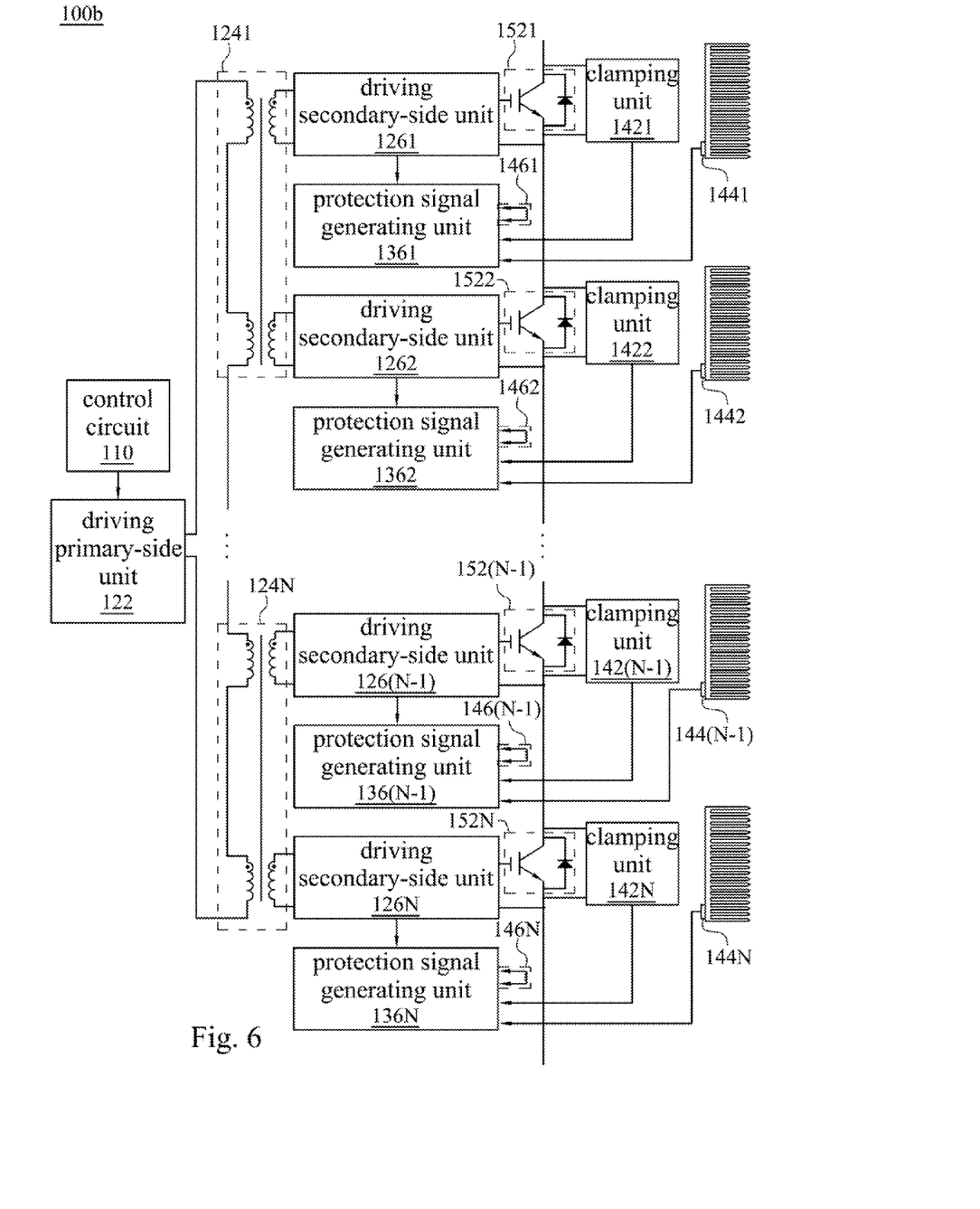
FIG. 6 is a schematic diagram illustrating a partial circuit of a power conversion device according to still another embodiment of the present disclosure.
Figure 7:
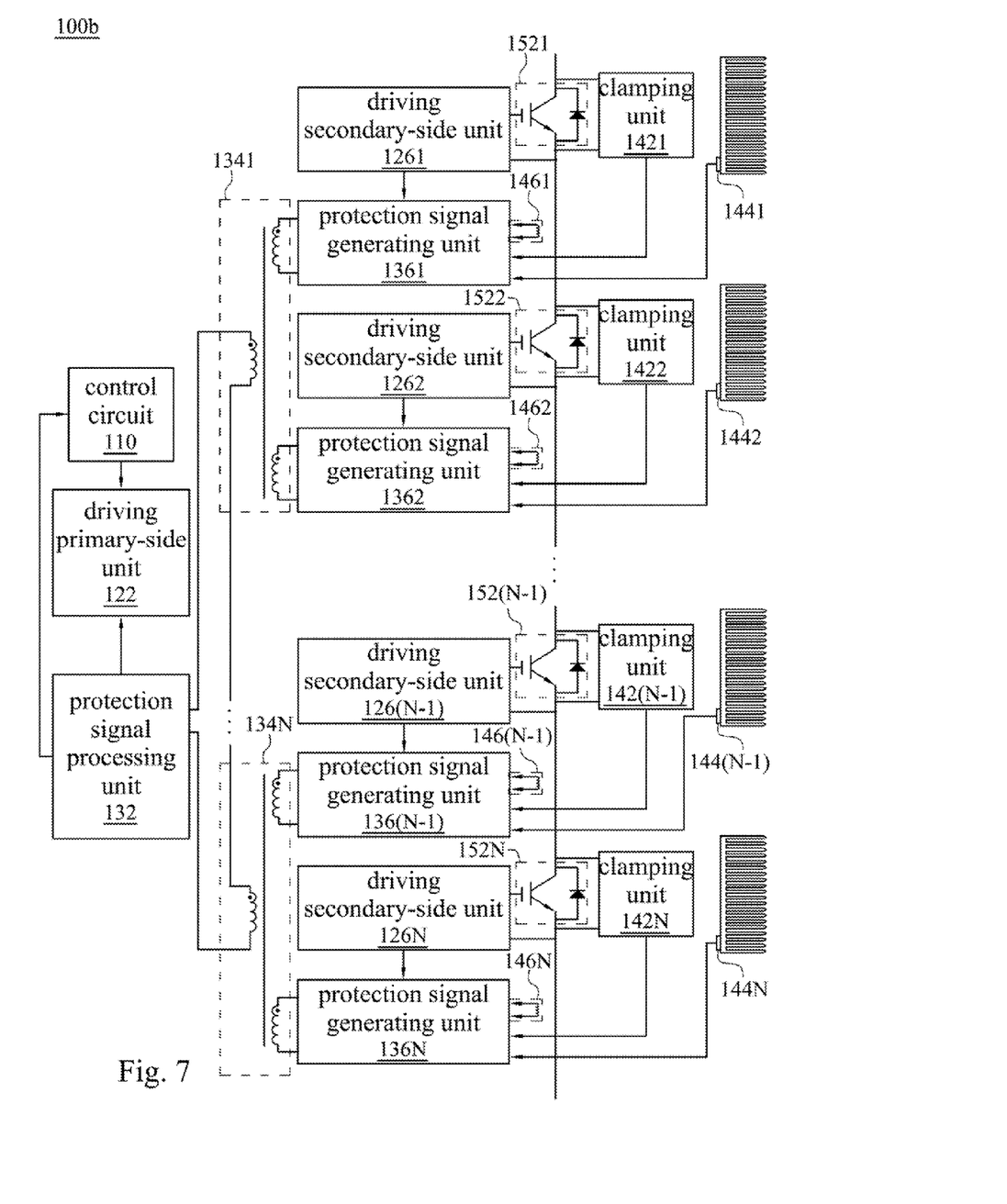
FIG. 7 is a schematic diagram illustrating a partial circuit of a power conversion device according to yet another embodiment of the present disclosure.

FIG. 6 is a schematic diagram illustrating a partial circuit of a power conversion device 100b according to still another embodiment of the present disclosure. FIG. 7 is a schematic diagram illustrating a partial circuit of a power conversion device according to yet another embodiment of the present disclosure. It should be noted that the partial circuit of the power conversion device 100b illustrated in FIG. 6 focuses on the connection between the driving primary-side unit 122 and the driving secondary-side units 1261~126N, while the partial circuit of the power conversion device 100b illustrated in FIG. 7 focuses on the connection between the protection signal processing unit 132 and the protection signal generating units 1361~136N. In practice, the partial circuits of the power conversion device 100b illustrated in FIG. 6 and FIG. 7 should be combined to form an overall power conversion device 100b. Here, the power conversion device 100b is divided into two portions to facilitate the understanding of the present disclosure by avoiding a complicated circuit connection.

It should be noted that, in the power conversion devices 100b of FIG. 6 and FIG. 7, the reference numbers of the electronic components that are similar to those used in the power conversion device 100a illustrated in FIG. 2 have the same electrical operating characteristics. For the sake of brevity, the electric components with similar reference numbers will not be discussed in detail hereinbelow, and rather, only the differences between the power conversion device 100a and the power conversion device 100b are discussed.

FIG. 6 and FIG. 7 illustrate detailed structural connections of the driving secondary-side units 1261~126N and a plurality of fault detecting circuits coupled to the power semiconductor switches 1521~152N in the power semiconductor switch module 150. Each driving secondary-side unit is correspondingly coupled to a power semiconductor switch, and each fault detecting circuit detects a corresponding power semiconductor switch and a corresponding driving secondary-side unit. The fault detecting circuit is coupled to the protection signal generating units 1361~136N. For example, the protection signal generating unit 1361 is coupled to a corresponding fault detecting circuit. Moreover, FIG. 6 and FIG. 7 schematically illustrate the implementation of the fault detecting circuit. A plurality of fault detecting circuits comprise a plurality of undervoltage fault detecting circuits, a plurality of overvoltage fault detecting circuits, a plurality of short-circuit fault detecting circuits 1461~146N and a plurality of over-heat fault detecting circuits 1441~144N. Each of the plurality of fault detecting circuits correspondingly detects whether one of the power semiconductor switches 1521~152N in the power semiconductor switch module 150 has an overvoltage fault, short-circuit fault, or over-heat fault, and whether the power source of one of the driving secondary-side units 1261~126N has an undervoltage fault or overvoltage fault. When the fault detecting circuit detects one or more of the above-mentioned faults, the fault detecting circuit outputs a corresponding fault signal or a plurality of fault signals to the protection signal generating units 1361~136N, and the protection signal generating units 1361~136N generate a corresponding fault pulse signal according to the one or more received fault signals. When there are multiple fault signals, the protection signal generating units 1361~136N perform a logic "OR" process with respect to the plurality of fault signals so as to generate a fault pulse signal.

Regarding the detection of an undervoltage fault, it is possible to sample from the driving signal transmitting circuit to detect whether the power source of the driving signal transmitting circuit is in an undervoltage condition; moreover, it is possible to sample from the driving secondary-side units 1261~126N to detect whether the supplying power source of the driving secondary-side unit is in an undervoltage condition. If it has been detected that the supplying power source of the driving secondary-side unit is in an undervoltage condition, the undervoltage fault detecting circuit (not shown) is used to provide an undervoltage fault signal to the protection signal generating units 1361~136N. Regarding overvoltage fault detection, this may be sampled from the clamping circuits 1421~142N to detect whether the power semiconductor switches 1521~152N are in an overvoltage condition. If it has been detected that the power semiconductor switches 1521~152N are in an overvoltage condition, the overvoltage fault detecting circuit (not shown) is used to provide an overvoltage fault signal to the protection signal generating units 1361~136N. In other embodiments, overvoltage fault detection can also sample from the driving signal transmitting circuit to detect whether the power source of the driving signal transmitting circuit is in an overvoltage condition; moreover, it is possible to sample from the supplying power source of the driving secondary-side units 1261~126N to detect whether the supplying power source of the driving secondary-side units 1261~126N is in an overvoltage condition. If it has been detected that the supplying power source of the driving secondary-side units 1261~126N is in an overvoltage condition, an overvoltage fault signal is provided to the protection signal generating units 1361~136N.

As to the detection of a short-circuit fault, it is possible to use the short-circuit fault detecting circuits 1461~146N to sample the power semiconductor switches 1521~152N to detect whether the power semiconductor switches 1521~152N are in short circuit conditions. If it has been detected that the power semiconductor switches 1521~152N are in short circuit conditions, the short-circuit fault detecting circuits 1461~146N are used to provide a short-circuit fault signal to the protection signal generating units 1361~136N. In one embodiment, the short-circuit fault detecting circuits 1461~146N may use an inductor to detect whether the power semiconductor switches are in short-circuit conditions. Regarding the detection of an over-heat fault, it is possible to sample from the over-heat fault detecting circuit 1441~144N to detect whether the power semiconductor switches 1521~152N are in over-heat conditions. If it has been detected that the power semiconductor switches 1521~152N are in over-heat conditions, the over-heat fault detecting circuits 1441~144N are used to provide an over-heat fault signal to the protection signal generating units 1361~136N. In one embodiment, the over-heat fault detecting circuits 1441~144N can be installed on a heat sink of the power semiconductor switch module 150.

It should be noted that when any one of the above-mentioned undervoltage fault, overvoltage fault, short-circuit fault and over-heat fault occurs, the resulting fault signal is transmitted to the protection signal generating units 1361~136N, and the protection signal generating units 1361~136N generate a corresponding fault pulse signal and return this signal via the isolated pulse transforming unit 134 and the protection signal processing unit 132, so as to turn off the power semiconductor switch module 150.

While implementing the above-mentioned embodiments according to the present disclosure, said power semiconductor switches can be a bipolar junction transistor (BJT), a field-effect transistor (FET), an insulated gate bipolar transistor (IGBT), etc., but are not limited in this regard. Persons having ordinary skill in the art can adaptively select a suitable means for implementing the present disclosure depending on actual needs, without departing from the spirit of the embodiments of the present disclosure.

Figure 8:
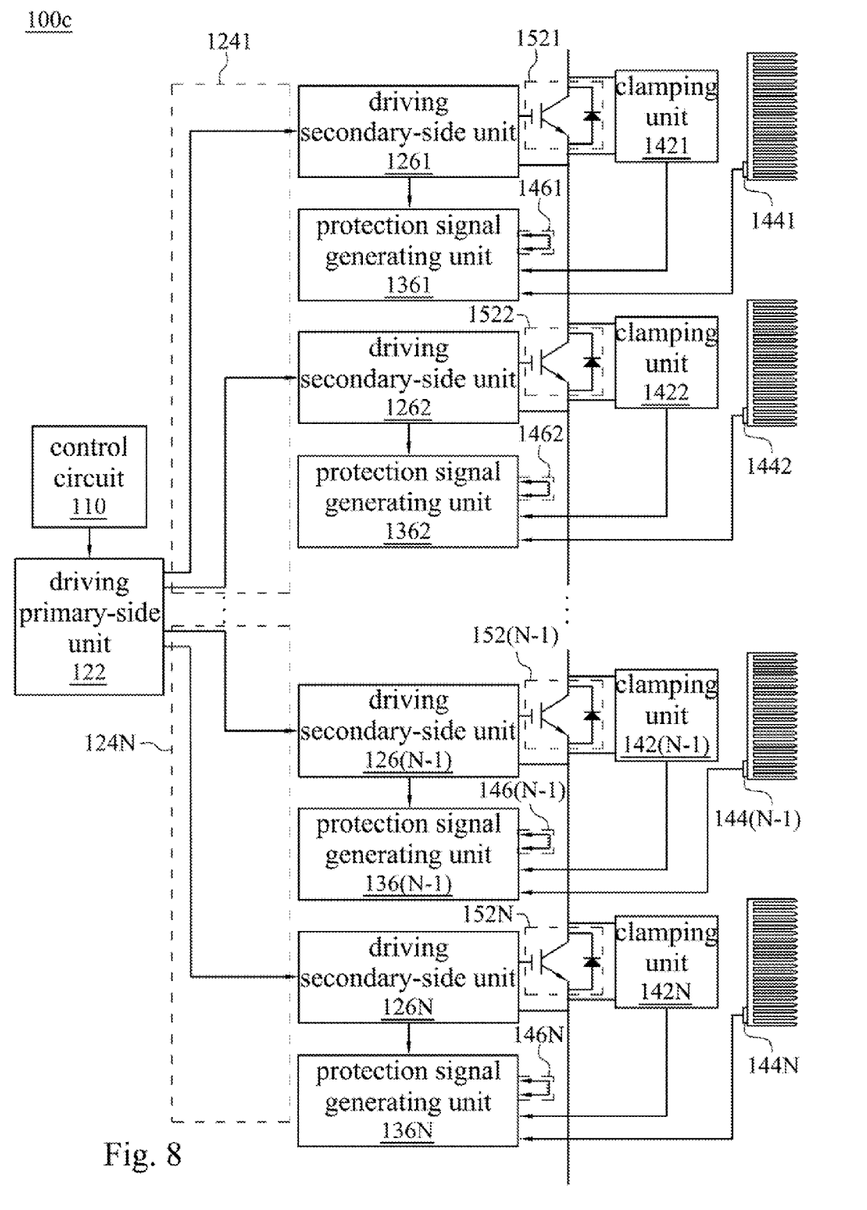
FIG. 8 is a schematic diagram illustrating a partial circuit of a power conversion device according to still yet another embodiment of the present disclosure.

FIG. 8 is a schematic diagram illustrating a partial circuit of a power conversion device 100c according to another embodiment of the present disclosure. It should be noted that, similar to the partial circuit of the power conversion device 100b in FIG. 6, the partial circuit of the power conversion device 100c illustrated in FIG. 8 also focuses on the connection between the driving primary-side unit 122 and the driving secondary-side units 1261~126N. The difference between said two embodiments resides in the fact that the partial circuit of the power conversion device 100c illustrated in FIG. 8 uses an optical-isolation component for signal isolation. For example, the signal isolating units 1241~124N can be signal light-isolating units, while the partial circuit of the power conversion device 100b illustrated in FIG. 6 uses a driving pulse-isolation transformer for signal isolation. In the present embodiment, the driving primary-side unit 122 receives the control signal provided by the control circuit, and generates a primary-side signal according to the control signal. The primary-side signal is transmitted to the driving secondary-side units 1261~126N via the signal light-isolating unit (for example, optic fibers 1241~124N). In response, the driving secondary-side units 1261~126N generate driving signals according to the received primary-side signals, in which the driving signals are used to drive the corresponding power semiconductor switches.

In one embodiment, the present disclosure provides a method for transmitting a protection signal in a power conversion device. The method for transmitting a protection signal comprises the following steps:

Step 210: detecting one of a plurality of power semiconductor switches in the power semiconductor switch module and a driving signal transmitting circuit, and when one of the plurality of power semiconductor switches, or the driving signal transmitting circuit or the combination of both is/are malfunctioning, generating a fault signal;

Step 220: generating a corresponding fault pulse signal according to the fault signal;

Step 230: using an isolated pulse transforming unit to receive the fault pulse signal, and outputting a protection pulse signal;

Step 240: generating a protection signal according to the protection pulse signal;

Step 250: receiving the protection signal; and

Step 260: generating a control-terminal turn-off signal according to the protection signal, and transmitting the control-terminal turn-off signal to the power semiconductor switch module to turn off the power semiconductor switch module.

To facilitate the understanding of the above-mentioned method for transmitting a protection signal, reference is also directed to FIG. 2. It should be noted that the steps of the method for transmitting a protection signal in the power conversion device can be performed by components other than the components of the power conversion device 100a illustrated in FIG. 2. The following description is provided to illustrate one implementation of the present disclosure. In Step 210, the fault detecting circuits 1401~140N can be used to detect the power semiconductor switches in the power semiconductor switch module 150 or the driving signal transmitting circuit 120, or the combination of both, and when any of the power semiconductor switches or the driving signal transmitting circuit 120, or the combination of both is/are malfunctioning, the fault detecting circuits 1401~140N generate a fault signal. In Step 220, the protection signal generating units 1361~136N are used to generate a corresponding fault pulse signal according to the fault signal. In Step 230, the isolated pulse transforming unit 134 can be used to receive the fault pulse signal and output a protection pulse signal. In Step 240, the protection signal processing unit 132 receives the protection pulse signal and generates a protection signal according to the protection pulse signal. In Step 250, the control circuit 110 receives the protection signal. In Step 260, the control circuit 110 is used to generate a control-terminal turn-off signal according to the protection signal, and transmit the control-terminal turn-off signal to the power semiconductor switch module 150 to turn off the power semiconductor switch module 150.

In one embodiment, referring to FIG. 1, in Step 260, the process for transmitting the control-terminal turn-off signal to the power semiconductor switch module can be performed by the control circuit 110 being used to transmit the control-terminal turn-off signal to the power semiconductor switch module 150 via the driving signal transmitting circuit 120.

In another embodiment, referring to FIG. 1, the method for transmitting a protection signal in a power conversion device may further use the protection signal processing unit 132 to simultaneously transmit the protection signal to the control circuit 110 and the driving signal transmitting circuit 120.

In still another embodiment, referring to FIG. 1, the method for transmitting a protection signal in a power conversion device may further use the driving signal transmitting circuit 120 to generate a driving-terminal turn-off signal according to the protection signal, and transmit the driving-terminal turn-off signal to the power semiconductor switch module 150 to turn off the power semiconductor switch module 150.

In yet another embodiment, referring to FIG. 1, the method for transmitting a protection signal in a power conversion device may further use the control circuit 110 to output the control signal, and then use the driving primary-side unit 122 is used to receive and process the control signal, after which the processed signal is transmitted to the driving secondary-side unit 126 using the signal isolating unit 124. The signal is then converted into a driving signal using the driving secondary-side unit 126, so as to drive the power semiconductor switch module 150.

In another embodiment, referring to FIG. 6, in Step 210, the process for detecting the power semiconductor switches in the power semiconductor switch module 150 comprises using an overvoltage fault detecting circuit to detect whether the power semiconductor switches in the power semiconductor switch module 150 are in overvoltage conditions, using the short-circuit fault detecting circuits 1461~146N to detect whether the power semiconductor switches in the power semiconductor switch module 150 are in short-circuited conditions, and using the over-heat fault detecting circuits 1441~144N to detect whether the power semiconductor switches in the power semiconductor switch module 150 are in over-heated conditions.

In another embodiment, referring to FIG. 6, in Step 210, the process for detecting the driving signal transmitting circuit 120 comprises using the undervoltage fault detecting circuit to detect whether the power source of the driving signal transmitting circuit is in an undervoltage condition, and further detecting whether the power source of the driving secondary-side units 1261~126N in the driving signal transmitting circuit 120 is in an undervoltage condition; and using the overvoltage fault detecting circuit to detect whether the power source of the driving signal transmitting circuit 120 is in an overvoltage condition, and further detecting whether the power source of the driving secondary-side units 1261~126N in the driving signal transmitting circuit 120 is in an overvoltage condition.

The above-described method for transmitting a protection signal in the power conversion device can be implemented by software, hardware, and/or firmware. For example, if an implementer determines that speed and accuracy are paramount, the implementer may opt for a mainly hardware and/or firmware implementation; if flexibility is paramount, the implementer may opt for a mainly software implementation; alternatively, the collaboration of software, hardware and firmware may be adopted. It should be noted that none of the above-mentioned examples is inherently superior to the other and shall be considered limiting to the scope of the present disclosure; rather, these examples can be utilized depending upon the context in which the unit/component will be deployed and the specific concerns of the implementer.

Further, as may be appreciated by persons having ordinary skill in the art, the steps of the method for transmitting a protection signal in the power conversion device are named according to the function they perform, and such naming is provided to facilitate the understanding of the present disclosure but not to limit the steps. Combining the step into a single step or dividing any one of the steps into multiple steps, or switching any step so as to be a part of another step falls within the scope of the embodiments of the present disclosure.

In view of the above embodiments of the present disclosure, it is apparent that the application of the present disclosure has a number of advantages. Embodiments of the present disclosure provide a power conversion device and a method for transmitting a protection signal using said device to address the problems of high manufacturing cost and low reliability caused by using an optical-isolation component to transmit a fault signal, as well as the problem of complicated structure of an electronic power device resulting from the fact that each power semiconductor switch requires an individual isolated pulse transformer to return the fault signal thereof.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power conversion device, comprising:
   a power semiconductor switch module, comprising a plurality of power semiconductor switches;
   a driving signal transmitting circuit electrically coupled to the power semiconductor switch module, and configured to receive a control signal and generate a driving signal according to the control signal to drive the conduction or non-conduction of the power semiconductor switch module; and
   a plurality of fault detecting circuits, wherein each of the plurality of fault detecting circuits is configured to correspondingly detect one of the plurality of power semiconductor switches and/or the driving signal transmitting circuit, and generate a fault signal when one of the plurality of power semiconductor switches and/or the driving signal transmitting circuit is malfunctioning;
   a protection signal transmitting circuit, comprising:
      an isolated pulse transforming unit coupled to the plurality of fault detecting circuits, and configured to receive a corresponding fault pulse signal generated according to the fault signal, and to output a protection pulse signal;
      a protection signal processing unit electrically coupled the isolated pulse transforming unit; and
      a plurality of protection signal generating units electrically coupled to the isolated pulse transforming unit, wherein each of the plurality of protection signal generating units is correspondingly coupled to the one of the plurality of fault detecting circuits,
      wherein the isolated pulse transforming unit comprises a plurality of input windings, and only one output winding, each of the plurality of input windings is correspondingly electrically coupled to the one of the plurality of protection signal generating units, and the only one output winding is electrically coupled to the protection signal processing unit;
   a control circuit coupled to the driving signal transmitting circuit and the protection signal processing unit, and configured to generate the control signal and receive a protection signal generated according to the protection pulse signal, and generate a control-terminal turn-off signal according to the protection signal to turn off the power semiconductor switch module.

2. The power conversion device of claim 1, wherein the protection signal processing unit configured to receive the protection pulse signal, wherein the protection signal processing unit generates the protection signal according to the protection pulse signal and transmits the protection signal to the control circuit.

3. The power conversion device of claim 2, wherein the protection signal processing unit simultaneously transmits the protection signal to the control circuit and the driving signal transmitting circuit.

4. The power conversion device of claim 3, wherein the driving signal transmitting circuit is configured to generate a driving-terminal turn-off signal according to the protection signal and transmit the driving-terminal turn-off signal to turn off the power semiconductor switch module.

5. The power conversion device of claim 2, wherein the plurality of protection signal generating units generates the corresponding fault pulse signal according to the fault signal.

6. The power conversion device of claim 5, wherein the isolated pulse transforming unit further comprises a plurality of magnetic cores and a plurality of windings serially connected in turn to form the only one output winding, wherein the plurality of magnetic cores, the plurality of windings and the plurality of input windings form a plurality of pulse transformers.

7. The power conversion device of claim 5, wherein the isolated pulse transforming unit further comprises:
a magnetic core, wherein the magnetic core, the only one output winding and the plurality of input windings form a pulse transformer.

8. The power conversion device of claim 5, wherein the isolated pulse transforming unit further comprises:
a plurality of magnetic cores and a plurality of windings serially connected in turn to form the only one output winding, wherein the plurality of magnetic cores, the plurality of windings and the plurality of input windings form a plurality of pulse transformers, wherein one of the plurality of pulse transformers comprises one of the input windings, one of the magnetic cores and one of the windings; another one of the plurality of pulse transformers comprises a plurality of input windings, one of the magnetic cores and one of the windings.

9. The power conversion device of claim 1, wherein the driving signal transmitting circuit comprises:
a driving primary-side unit configured to receive the control signal and generate a driving pulse signal according to the control signal;
a signal magnetic-isolating unit configured to receive and transmit the driving pulse signal; and
a driving secondary-side unit configured to receive the driving pulse signal and convert the driving pulse signal into the driving signal to drive the power semiconductor switch module.

10. The power conversion device of claim 1, wherein the driving signal transmitting circuit comprises:
a driving primary-side unit configured to receive the control signal and generate a primary-side signal according to the control signal;
a signal light-isolating unit configured to receive and transmit the primary-side signal; and
a driving secondary-side unit configured to receive the primary-side signal and convert the primary-side signal into the driving signal to drive the power semiconductor switch module.

11. The power conversion device of claim 9, wherein the number of the driving secondary-side unit is more than one, and each of the plurality of driving secondary-side units is correspondingly electrically coupled to the one of the plurality of power semiconductor switches of the power semiconductor switch module.

12. The power conversion device of claim 11, wherein the signal magnetic-isolating unit comprises:
a plurality of driving pulse-isolation transformers, wherein each of the plurality of driving pulse-isolation transformers comprises an input winding, a magnetic core and an output winding; the output winding of each of the plurality of driving pulse-isolation transformers is correspondingly electrically coupled to the one of the plurality of driving secondary-side units; and the plurality of input windings of the plurality of driving pulse-isolation transformers are serially connected in turn, and electrically coupled to the driving primary-side unit.

13. The power conversion device of claim 11, wherein the signal magnetic-isolating unit comprises:
a driving pulse-isolation transformer, comprising an input winding, a magnetic core and a plurality of output windings, wherein each of the plurality of output windings is correspondingly electrically coupled to the one of the plurality of driving secondary-side units, and the input winding is electrically coupled to the driving primary-side unit.

14. The power conversion device of claim 11, wherein the signal magnetic-isolating unit comprises:
a plurality of driving pulse-isolation transformers, wherein one of the plurality of driving pulse-isolation transformers comprises an input winding, a magnetic core and an output winding; another one of the plurality of driving pulse-isolation transformers comprises an input winding, a magnetic core and a plurality of output winding; each of the plurality of output windings is correspondingly electrically coupled to the one of the plurality of driving secondary-side units; and the plurality of input windings are serially connected in turn and electrically coupled to the driving primary-side unit.

15. The power conversion device of claim 1, wherein each of the plurality of fault detecting circuits comprises at least one of a undervoltage fault detecting circuit, an overvoltage fault detecting circuit, a short-circuit fault detecting circuit and an over-heat fault detecting circuit.

16. The power conversion device of claim 9, wherein the plurality of fault detecting circuits comprises a plurality of power source undervoltage fault detecting circuits and a plurality of power source overvoltage detect circuits, the plurality of power source undervoltage fault detecting circuits are configured to detect the undervoltage fault of the corresponding power source of the plurality of driving secondary-side units, and the plurality of power source overvoltage detect circuits are configured to detect the overvoltage fault of the corresponding power source of the plurality of driving secondary-side units.

17. The power conversion device of claim 1, wherein the plurality of fault detecting circuits comprise a plurality of overvoltage fault detecting circuits, a plurality of short-circuit fault detecting circuits and a plurality of over-heat fault detecting circuits; the plurality of overvoltage fault detecting circuits are configured to detect the overvoltage fault of the corresponding plurality of power semiconductor switches; the plurality of short-circuit fault detecting circuits are configured to detect the short-circuit fault of the corresponding plurality of power semiconductor switches; and the plurality of over-heat fault detecting circuits are configured to detect the over-heat fault of the corresponding plurality of power semiconductor switches.

18. The power conversion device of claim 1, wherein the number of the power semiconductor switch module is more than one, and the control circuit turns off the plurality of power semiconductor switch modules according to the control-terminal turn-off signal.

19. A method for transmitting a protection signal of a power conversion device, comprising:
   detecting a plurality of power semiconductor switches within a power semiconductor switch module and/or a driving signal transmitting circuit, and generating a fault signal when one of the plurality of power semiconductor switches and/or a driving signal transmitting circuit is malfunctioning;
   using an isolated pulse transforming unit to receive a corresponding fault pulse signal generated according to the fault signal, and to output a protection pulse signal;
   receiving a protection signal generated according to the protection pulse signal; and
   generating a control-terminal turn-off signal according to the protection signal, and transmitting the control-terminal turn-off signal to turn off the power semiconductor switch module,
   wherein the isolated pulse transforming unit comprises a plurality of input windings and only one output winding, one of the plurality of input windings receives the corresponding fault pulse signal, and the only one output winding outputs the protection pulse signal.

20. The method for transmitting the protection signal of claim 19, wherein the step of transmitting the control-terminal turn-off signal to the power semiconductor switch module comprises:
   using a control circuit to transmit the control-terminal turn-off signal to the power semiconductor switch module via the driving signal transmitting circuit.

21. The method for transmitting the protection signal of claim 20, wherein the step of receiving the protection signal generated according to the protection pulse signal comprises:
   using a protection signal processing unit to generate the protection signal according to the protection pulse signal; and
   using the control circuit to receive the protection signal.

22. The method for transmitting the protection signal of claim 21, further comprising:
   using the protection signal processing unit to simultaneously transmit the protection signal to the control circuit and the driving signal transmitting circuit.

23. The method for transmitting the protection signal of claim 22, further comprising:
   using the driving signal transmitting circuit to generate a driving-terminal turn-off signal according to the protection signal, and to transmit the driving-terminal turn-off signal to turn off the power semiconductor switch module.

24. The method for transmitting the protection signal of claim 19, wherein the step of using the isolated pulse transforming unit to receive the corresponding fault pulse signal generated according to the fault signal generate comprises:
   using a plurality of protection signal generating units to generate a corresponding fault pulse signal according to the fault signal.

25. The method for transmitting the protection signal of claim 19, further comprising:
   receiving a control signal and transmitting the control signal; and
   converting the control signal into a driving signal to drive the power semiconductor switch module.

26. The method for transmitting the protection signal of claim 19, wherein the step of detecting one of the plurality of power semiconductor switches in the power semiconductor switch module comprises:
   detecting whether one of the plurality of power semiconductor switches of the power semiconductor switch module is in an overvoltage condition;
   detecting whether one of the plurality of power semiconductor switches of the power semiconductor switch module is in a short-circuited condition; and
   detecting whether one of the plurality of power semiconductor switches of the power semiconductor switch module is in an over-heated condition.

27. The method for transmitting the protection signal of claim 19, wherein the step of detecting the driving signal transmitting circuit comprises:
   detecting whether the power source of the driving signal transmitting circuit is in an undervoltage condition; and
   detecting whether the power source of the driving signal transmitting circuit is in an overvoltage condition.

28. The method for transmitting the protection signal of claim 27, wherein the step of detecting the driving signal transmitting circuit further comprises:
   detecting whether the power source of a driving secondary-side unit in the driving signal transmitting circuit is in an under voltage condition; and
   detecting whether the power source of the driving secondary-side unit in the driving signal transmitting circuit is in an overvoltage condition.

* * * * *